United States Patent [19]

Moore

[11] 4,242,653
[45] Dec. 30, 1980

[54] TRIPLE TRANSIT SUPPRESSION FOR BULK ACOUSTIC DELAY LINES

[75] Inventor: Robert A. Moore, Arnold, Md.

[73] Assignee: Westinghouse Electric Corp., Pittsburgh, Pa.

[21] Appl. No.: 37,070

[22] Filed: May 8, 1979

[51] Int. Cl.² .................. H03H 9/30; H01L 41/10
[52] U.S. Cl. ........................... 333/141; 333/143; 333/151
[58] Field of Search ..................... 333/141–145, 333/149, 151, 194; 310/311, 317–319, 328, 333, 365, 366

[56] References Cited

U.S. PATENT DOCUMENTS

| | | | |
|---|---|---|---|
| 3,810,257 | 5/1974 | Jones et al. | 333/151 |
| 4,099,147 | 7/1978 | McAvoy | 333/143 |

OTHER PUBLICATIONS

Lewis, "Triple Transit Suppression in Surface-Acoustic-Wave Devices", in Electronics Letters, Nov. 16, 1972, vol. 8, No. 23, pp. 553–554.

Sperry et al., "Wideband Microwave Acoustic Delay Line with Exceptionally Smooth Phase and Loss Response", Digest of the International Microwave Theory and Technique Symposium Sponsored by the IEEE, May 17, 1971, pp. 62–63.

*Primary Examiner*—Marvin L. Nussbaum
*Attorney, Agent, or Firm*—R. M. Trepp

[57] ABSTRACT

Electroacoustic apparatus is described incorporating a substrate having a plurality of transducers on an upper surface and a plurality of transducers on a lower surface each positioned for receiving bulk acoustic waves from a respective transducer on the upper surface wherein each receiving transducer has a predetermined acoustical path length from its respective transducer on the upper surface, means for coupling an input signal to the transducers on the upper surface, and means for coupling an output signal from the transducers on the lower surface. The invention further provides a plurality of bulk mode acoustic delay lines having predetermined acoustical path lengths which are coupled in parallel to suppress the triple transit signal.

The invention overcomes the problem of spurious triple transit signals in bulk mode acoustic delay lines for input signals having a wide bandwith, such as an octave.

2 Claims, 10 Drawing Figures

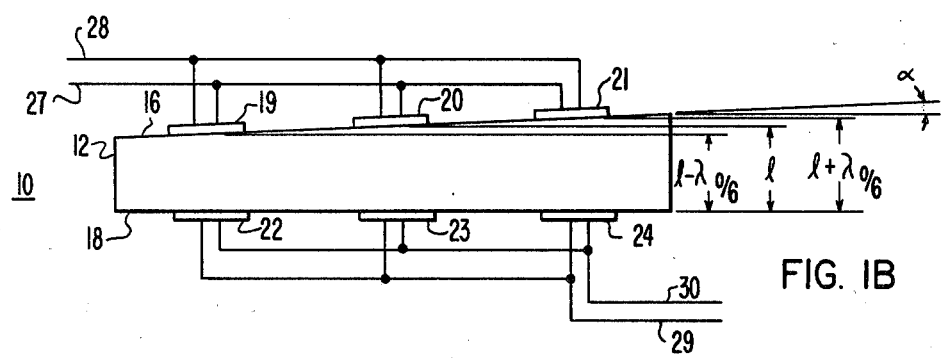
FIG. 1B
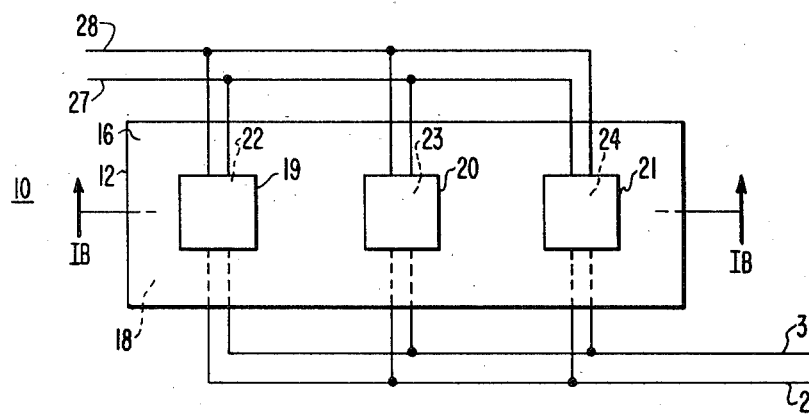
FIG. 1A
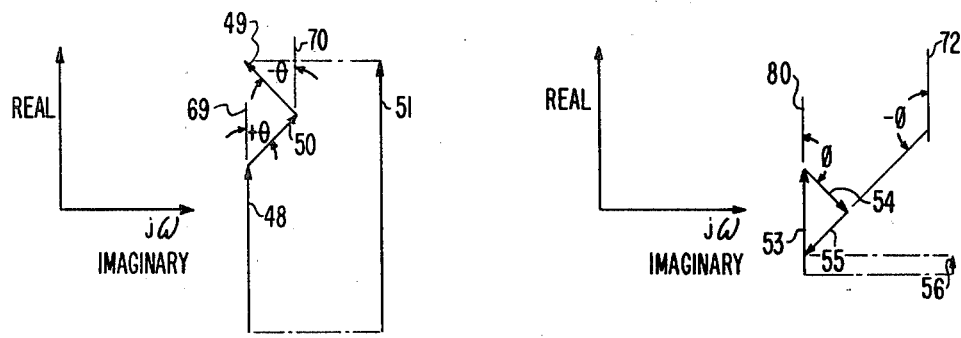
FIG. 3
FIG. 4

TRIPLE TRANSIT SUPPRESSION FOR BULK ACOUSTIC DELAY LINES

GOVERNMENT CONTRACT

The invention herein described was made in the course of or under a contract or subcontract thereunder with the Department of the Army.

BACKGROUND OF THE INVENTION

1. Field of the Invention

This invention relates to electroacoustic apparatus, particularly to bulk mode acoustic delay devices.

2. Description of the Prior Art

In the prior art, multiple reflections from bulk acoustic waves in delay lines have caused undesirable output signals. A bulk mode acoustic delay line having a transducer at either end of a substrate provides a desired output signal after a bulk acoustic wave is generated and travels from the input transducer to the output and an undesired triple transit output after the bulk acoustic wave is reflected at the output and travels back and forth through the delay line to the output again. The triple transit output causes an interference ripple in the band pass of the delay line corresponding to the difference in the delay between the direct output and the triple transit output. The interference period for a triple transit output is $\Delta f = \frac{1}{2}\tau$ where $\tau$ is a delay time of the delay line. One example of a bulk acoustic delay device for delaying signals and for providing triple transit suppression is described in U.S. Pat. No. 4,099,149 issued on July 4, 1978 entitled "Bulk Acoustic Delay Device" by Bruce R. McAvoy and assigned to the assignee herein. In U.S. Pat. No. 4,099,147 the input transducer provides a predetermined defraction in the bulk acoustic wave launched causing the bulk acoustic wave to spread laterally as it propagates through the medium. The bulk acoustic wave impinges upon a receiving transducer to provide a direct output. The bulk acoustic wave after traversing the delay line three times impinges upon the receiving transducer and an additional transducer spaced outwards to intercept only the triple transit wave. The triple transit output is attenuated due to a difference in the acoustical path lengths from the input to the two receiving transducers to provide a phase difference of the two received singles. Bulk acoustic waves traveling through the medium also exhibit path attenuation due to the distance the wave travels which also reduces the triple transit signal.

An alternate approach to provide triple transit suppression in a bulk acoustic delay line is described in a paper entitled "Wideband Microwave Acoustic Delay Line With Exceptionally Smooth Phase and Loss Response" by W. R. Sperry, E. P. Kirchner and T. M. Reeder published in the digest of the International Microwave Theory and Technique Symposium sponsored by the IEEE on May 17, 1971. In the paper, triple transit suppression is enhanced by using an angled end face to place the null in the radiation pattern of the triple transit signal, launched at the input transducer aperture, at the position of the output transducer aperture. In other words, the beam axis of the bulk acoustic wave launched by the transducer is tilted or directed such that on the third transit the main beam energy misses the receiving transducer and only the side lobes are seen. The beam axis tilting approach is useful only where the input and output transducers are in the far zone relative to each other so that the acoustic beam is in the Fraunhofer field region at the output transducer.

The use of additional receiving transducers in a surface acoustic wave delay device to provide triple transit suppression by means of phase interference has been described in a paper entitled "Triple-Transit Suppression in Surface-Acoustic-Wave Devices" by M. F. Lewis published in Electronic Letters, Volume 8, Number 23, pages 553–554 on Nov. 16, 1972. In FIG. 2, two dummy interdigital transducers are spaced an additional distance of $\pm\gamma/4$ to reflect back to the input transducer two signals which are $\pm 180°$ out of phase with the reflection of the wave from the output transducer. The reflected waves are cancelled at the input transducer leaving no surface acoustic wave to be reflected by the input transducer to become the triple transit at the output transducer. Hulling the reflected signal at the input transducer will not provide triple transit suppression in bulk mode acoustic delay lines.

It is therefore desirable to provide electroacoustic apparatus for delaying signals and for providing wide band triple transit suppression in bulk acoustic delay lines about a predetermined center frequency.

It is further desirable to provide bulk acoustic wave delay lines that can delay signals of an extremely broad band width such as an octave bandwidth with triple transit suppression for delays of 0.5 microseconds or less.

It is further desirable to combine a number of bulk acoustic delay lines having different acoustic path lengths to act as one delay line having triple transit suppression.

SUMMARY OF THE INVENTION

In accordance with the present invention, electroacoustic apparatus is provided for delaying signals and for providing wide band triple transit suppression about a predetermined center frequency comprising a substrate having an upper and lower surface, the substrate comprised of material suitable for propagating bulk acoustic waves, a first transducer mounted on the upper surface for generating bulk acoustic waves toward the lower surface, a second transducer mounted on the lower surface and positioned for receiving bulk acoustic waves from the first transducer and having a first acoustical path length from the first transducer to the second transducer, a third transducer mounted on the upper surface for generating bulk acoustic waves toward the lower surface, a fourth transducer mounted on the lower surface and positioned for receiving bulk acoustic waves from the third transducer and having a second acoustical path length from the third transducer to the fourth transducer, a fifth transducer mounted on the upper surface for generating bulk acoustic waves toward the lower surface, a sixth transducer mounted on the lower surface and positioned for receiving bulk acoustic waves from the fifth transducer and having a third acoustical path length from the fifth transducer to the sixth transducer, the second acoustical path length being less than the first acoustical path length by one sixth wavelength of the predetermined center frequency and the third acoustical path length being greater than the first acoustical path length by one sixth wavelength of the predetermined center frequency, means for coupling an input signal to the first, third and fifth transducer, and means for coupling an output signal from the second, fourth and sixth transducer.

The invention further provides electroacoustic apparatus for delaying signals and for providing wideband triple transit suppression about a predetermined center frequency comprising: a first, second, and third delay line each having an electrical input and electrical output and a predetermined delay time, first means for coupling an input signal to the input of the first, second, and third delay line, second means for coupling the output from the first, second, and third delay line together to provide an output signal, the first, second, and third delay line each including a substrate of material suitable for propagating bulk acoustic waves, a first transducer mounted on the substrate and coupled to the input for generating bulk acoustic waves from electrical signals, a second transducer mounted on the substrate and coupled to the output for generating electrical signals from bulk acoustic waves, the second transducer positioned to receive bulk acoustic waves generated by the first transducer, the first delay line having a predetermined delay time $\tau$, the second delay line having a predetermined delay time of $\tau$ less the time required for a bulk acoustic wave of the predetermined center frequency to travel one sixth of its wave length, the third delay line having a predetermined delay time of $\tau$ plus the time required for a bulk acoustic wave of the predetermined center frequency to travel one sixth of its wave length whereby the output signals from the three delay lines combine to provide a reduced output signal from bulk acoustic waves traversing each of the delay lines three times.

DESCRIPTION OF THE DRAWINGS

FIG. 1A is a plan view of one embodiment of the invention.

FIG. 1B is a cross section view along the lines IB—IB of FIG. 1A.

FIG. 3 is a vector diagram showing the operation of the embodiment of FIGS. 1A and 2A after one pass of a bulk acoustic wave to the substrate medium.

FIG. 4 is a vector diagram showing the operation of the embodiment of FIGS. 1 and 2 after three passes of a bulk acoustic wave through the medium.

DESCRIPTION OF THE PREFERRED EMBODIMENT

Figure 2B:
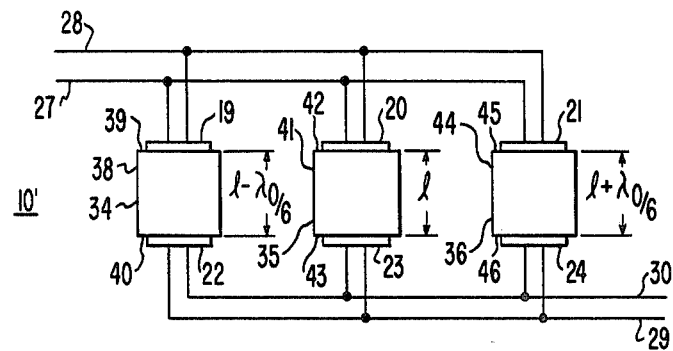
FIG. 2B is a cross section view along the lines IIB—IIB of FIG. 2A.

Referring now to the drawings, FIGS. 1A and 1B show an electroacoustic apparatus 10 for delaying signals and for providing wide band triple transit suppression about a predetermined center frequency. A substrate 12 is shown having an upper surface 16 and a lower surface 18. Substrate 12 is comprised of material suitable for propagating bulk acoustic waves. By way of example, materials that would be suitable for substrate 12 are materials that are piezoelectric, non-piezoelectric, insulating, semiconductor and conducting. The upper surface 16 and the lower surface 18 may be planar suitable for subsequent photolithic steps for fabricating the electrode patterns of transducers. The upper surface 16 may be at an acute angle and spaced apart from the lower surface 16 so as to provide a variation of thickness at various locations on the substrate for the transducers. Alternately, the upper surface 16 may be irregular relative to the lower surface 18 to provide various thicknesses at various locations prior to depositing the transducers. In FIG. 1 the upper surface 16 is shown at an acute angle of $\alpha$ with respect to the lower surface 18. Transducers 19, 20 and 21 ae shown mounted on the upper surface 16. Transducers 22, 23, and 24 are shown mounted on the lower surface 18. Transducers 19 through 24 may for example be suitable for operation in the frequency range from 1 through 6 gigahertz or portions thereof and may be fabricated using vapor deposition techniques. For example, in fabricating a transducer an electrode is deposited on the substrate 12 and a piezoelectric material, such as zinc oxide or cadmium sulfide or other suitable transducer material may be vacuumed deposited over the electrode. The piezoelectric material may be deposited to a thickness of about $\frac{1}{3}$ to $\frac{1}{2}$ wave length of the mid-band frequency of the transducer. An electrode is deposited over the piezoelectric material and the lower electrode to form a sandwich in the area where transducer action is desired. The electrode area of the transducer corresponds to the aperture from which ultrasonic waves propagate into substrate 12. The method of depositing piezoelectric transducers may be found in U.S. Pat. No. 3,655,429 issued on Apr. 11, 1972 to John D. DeKlerk and assigned to the assignee herein.

Transducers 19, 20 and 21 function to generate bulk acoustic waves toward lower surface 18 through substrate 12. Transducer 22 mounted on lower surface 18 is positioned for receiving bulk acoustic waves from transducer 19. Transducer 23 is mounted on the lower surface 18 and positioned for receiving bulk acoustic waves from transducer 20. Transducer 24 is mounted on the lower surface 18 and positioned for receiving bulk acoustic waves from transducer 21.

Transducers 20 and 23 are positioned on substrate 12 to have a predetermined distance between themselves for bulk acoustic waves to travel. The distance between the transducers 20 and 23 may be called acoustical path length 1 (where 1 is the lower case typewritten L). Transducers 19 and 22 are positioned on substrate 12 and have an acoustical path length between themselves for both acoustic waves of 1 less the distance of one six wavelength of a predetermined mid-band frequency or center frequency. Transducers 21 and 24 are positioned on substrate 12 to have a predetermined distance between the themselves for bulk acoustic waves of 1 plus the distance of one sixth wavelength of a predetermined mid-band frequence or center frequency.

Lines 27 and 28 provide a means for coupling an input signal to transducers 19, 20 and 21. Lines 29 and 30 provide a means for coupling an output signal from transducers 22, 23 and 24 together and to provide an output signal.

Figure 2A:
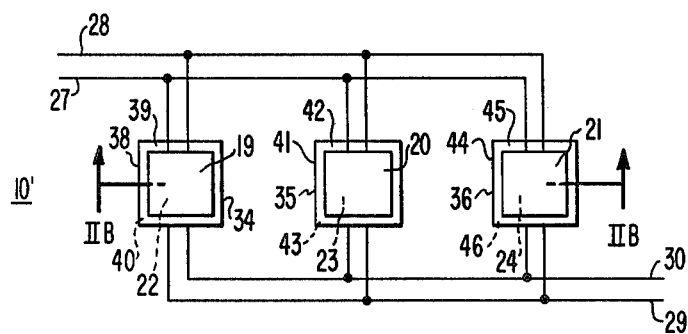
FIG. 2A is a plan view of an alternate embodiment of the invention.

FIGS. 2A and 2B show an alternate embodiment of the invention. In FIGS. 2A and 2B like references are used for functions corresponding to the apparatus of FIG. 1A. FIGS. 2A and 2B show electroacoustic apparatus 10' for delaying signals and for providing wide band triple transit suppression about a predetermined center frequency. Delay lines 34, 35, and 36 are shown each having electrical input from lines 27 and 28 and an electrical output on lines 29 and 30. Each delay line 34, 35, and 36 has a predetermined delay time. Delay line 34 includes a substrate 38 comprised of material suitable for propagating bulk acoustic waves. Transducer 19 is mounted on upper surface 39 and coupled to input lines 27 and 28. Transducer 22 is mounted lower surface 40 of substrate 38 and coupled to output lines 29 and 30.

Delay line 35 has a substrate 41 comprising material suitable for propagating bulk acoustic waves and an upper surface 42 and a lower surface 43. Transducer 20 is mounted on upper surface 42 and is coupled to input lines 27 and 28. Transducer 23 is mounted lower surface 43 and coupled to lines 29 and 30. Delay line 36 has a substrate 44 comprising material suitable for propagating bulk acoustic waves and an upper surface 45 and a lower surface 46. Transducer 21 is mounted on upper surface 45 and coupled to lines 27 and 28. Transducer 24 is mounted on lower surface 46 and is coupled to lines 29 and 30. Transducers 19, 20, and 21 function to generate bulk acoustic waves from electrical signals on lines 27 and 28. Transducers 22, 23, and 24 function to generate electric signals from bulk acoustic waves received from its respective transducer 19, 20, or 21. Lines 29 and 30 provide a means for coupling the output signal from transducers 22, 23, and 24 together and to provide an output signal.

Delay line 35 may have a predetermined delay time $\tau$ which corresponds to a predetermined acoustical path length l. Delay line 34 has a predetermined delay time of $\tau$ less the time required for a bulk acoustic wave of a predetermined center frequency to travel one sixth of its wavelength. The delay time of delay line 34 corresponds to an acoustical path length of $1 - 1/6$ the wavelength of a predetermined center frequency. Delay line 36 has a delay time of $\tau$ plus the time required for a bulk acoustic wave of said predetermined center frequency to travel one sixth of its wavelength. The delay time of delay line 36 corresponds to an acoustical path length of $1 + 1/6$ the wavelength of a predetermined center frequency.

FIG. 3 is a vector diagram showing the operation of the embodiment of FIGS. 1 and 2 after one pass of a bulk acoustic wave through the substrate medium, from the upper surface to the lower surface. In FIG. 3 the ordinate represents the real axis and the abscissa represents the imaginary axis $J\Omega$. When transducer 20 in FIG. 1A or 2A transmits a bulk acoustic wave into substrate 12 or 41, the wave propagates and a portion is absorbed by transducer 23 which converts a portion of the bulk acoustic wave energy into an electrical signal. The electrical signal generated by a bulk acoustic wave traversing substrate 12 or 41 on time from transducer 20 is illustrated as vector 48 in FIG. 3. The amplitude of vector 48 is dependent upon the area of transducers 20 and 23.

Transducer 19 also generates a bulk acoustic wave in substrate 12 or 38 as shown in FIGS. 1A and 2A and a portion of which is absorbed by a transducer 22. Transducer 22 generates an electrical signal which may be represented by vector 49 in FIG. 3. Vector 49 has an angular displacement $-\theta$ relative to vector 48 due to the difference in acoustic path length which is one sixth the wave length of a predetermined center frequency.

Transducer 21 likewise generates a bulk acoustic wave in a substrate 12 or 44 as shown in FIGS. 1A and 2A from an input signal on lines 27 and 28. A portion of a bulk acoustic wave is absorbed by transducer 24 which generates an electrical signal represented by vector 50 in FIG. 3. Vector 50 has an angular displacement $+\theta$ relative to vector 48 due to the fact that it has a longer acoustic path length of one sixth the wave length of a predetermined center frequency. The amplitude of vectors 49 and 50 is dependent upon the area or size of transducers 19 and 22 and of 21 and 24.

In FIG. 3, the vectors are shown for an input signal of a particular frequency offset from a center frequency $F_0$. The center frequency may for example be 1.5 gigahertz. The angle $\theta$ as shown in FIG. 3 is equal to $\pi\Delta F/F_0$ where $\Delta F$ is the frequency deviation from $F_0$. Since for vectors 49 and 50 the acoustical path length is $\pm\gamma_0/6$ the angle $\theta$ is positive for vector 50 and negative for vector 49 resulting in a $\pm$ imaginary component along the $J\omega$ axis which cancel one another. If transducers 19 and 22 are each equal in area size to transducers 21 and 24, respectively, then the output signals on lines 29 and 30 from transistors 22 and 24 as shown in FIGS. 1A and 2A will be equal in amplitude. Thus vectors 49 and 50 at an angle of $\pm\theta$ will have equal amplitude and component along the $J\omega$ axis will be equal and will cancel out entirely. The resultant vector from all three transducers 22, 23, and 24 for a bulk acoustic wave passing once through the substrate medium is shown by vector 51 in FIG. 3. Vector 51 is merely the summation of vectors 48, 49, and 50. Vector 51 represents the output signal on lines 29 and 30 for a bulk acoustic wave of a predetermined frequency traversing substrate 12 or substrate 34, 35, and 36 once as shown in FIGS. 1A and 2A.

FIG. 4 is a vector diagram showing the operation of the embodiment of FIGS. 1A and 2A after three passes of a bulk acoustic wave through the substrate medium. In FIG. 4 the ordinate represents the real axis or real component of the electrical signal and the abscissa represents the imaginary axis $J\omega$. A bulk acoustic wave arriving at the lower surface 18 of substrate 12 of 40, 43 or 46 of substrates 38, 41 or 44, respectively, is reflected back towards the upper surface 16 of substrate 12 or upper surface 39, 42 or 45 of substrates 38, 41 or 44 respectively. The wave is rereflected from the upper surface and propagates towards the lower surface where it is sensed by transducer 22, 23 and 24 as an undesirable spurious signal. As the bulk acoustic wave propagates through the substrate medium 12, 38, 41 or 44 as shown in FIGS. 1A and 2A it is attenuated due to losses to the medium. After a wave traverses the substrate medium three times and is sensed by a transducer, it is called a triple transit signal. Most delay line designs attempt to attenuate the triple transit signal as is the purpose of the invention herein. The signal received by transducer 23 in FIGS. 1A and 2A may be represented by vector 53 in FIG. 4. Note it is smaller in amplitude than vector 48 in FIG. 3 due to propagation losses. The signal generated by transducer 22 in FIGS. 1A or 2A may be represented by vector 54 in FIG. 4. The signal generated by transducer 24 in FIGS. 1A and 2A may be represented by vector 55 in FIG. 4.

As can be seen in FIG. 4, vector 54 is at an angle $+\phi$ and vector 55 is at an angle $-\phi$. The angle $\phi$ is equal to $\pi \times 66 F/F_0$ where $\Delta F$ is the frequency deviation from $F_0$. $F_0$ is the center frequency of the delay line. If the amplitude of vectors 54 and 55 are the same, then the imaginary components of vectors 54 and 55 are equal and opposite and will cancel one another leaving only a real component which may be cancelled against vector 53. The sum of vectors 53, 54 and 55 are shown added together as vector 56. Vector 56 is small relative to vector 53 and represents the residue after triple transit cancellation due to the phase difference of the signals on transducers 22 and 24 to match and cancel the signal on transducer 23 shown in FIGS. 1A and 2A.

The suppression in decibels or the ratio of the power of the triple transit signal to the power of the direct signal passing through the electroacoustic apparatus 10 and 10' in FIGS. 1A and 2A, respectively, is represented by equation 1.

$$\text{Suppression (db)} = \frac{\text{Power of Triple Transit Signal}}{\text{Power of Direct Signal}} = 20 \, [\log_{10} (1 - \cos \frac{\pi \Delta f}{f_o}) - \log_{10}(1 + \cos \frac{\pi}{3} (1 + \frac{\Delta f}{f_o}))] \quad (1)$$

Equation 1 is for the case where the signals ariving at transducers 22 and 24 have a difference in acoustical path length of $\pm \gamma_0/6$ relative to the acoustical path length of signals arriving at transducer 23. In the preferred embodiment the signals at transducers 22 and 24 have one half the amplitude of the signal at transducer 23. This may be achieved by having each transducer 22 and 24 with an area one half of the area of transducer 23. Likewise transducers 19 and 21 would have the same area as or near the same area as transducers 22 and 24 and transducer 20 would have the same or near the same area as the transducer 23.

For best performance, the bulk acoustic wave generated by transducer 19, 20, and 21 are in the near zone where the cross-sectional area of the bulk acoustic wave remains the same as the original aperture or dimension of the transducer. The near zone extends from the transducer to a distance l away from the transducer governed by the relationship $l = 2D^2/\gamma X$ where D is the width of one side of a rectangular transducer, X is small such as less than 0.1 and is the wavelength of the ultrasonic wave in the transmission medium. $\gamma$ may be determined by the relationship of $\gamma = V/F$ where V is velocity of the ultrasonic elastic wave in the transmission medium and F is the frequency of ultrasonic wave. For silicon, the velocity of the bulk elastic wave is $9 \times 10^5$ centimeters per second.

Figure 5:
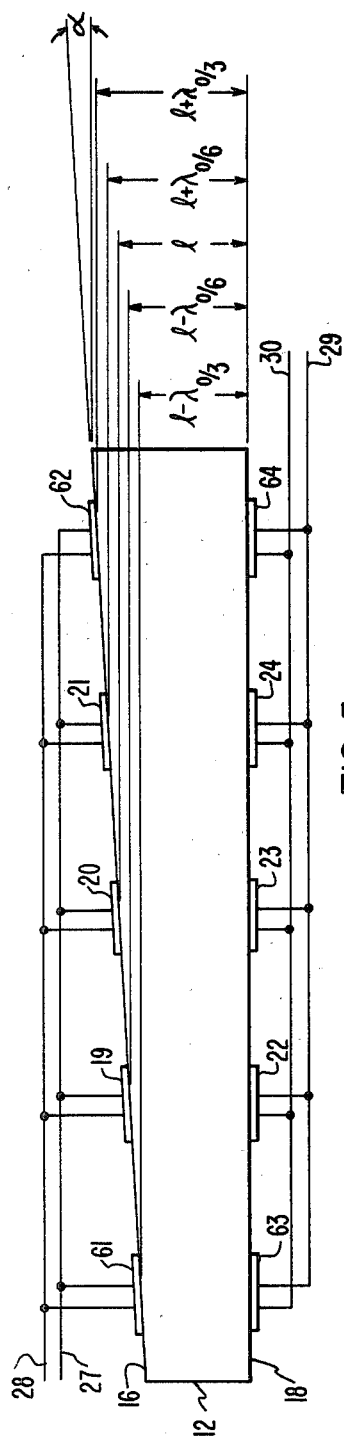
FIG. 5 is an alternate embodiment of the invention.

FIG. 5 is an alternative embodiment of the invention for providing triple transit cancellation or suppression. In FIG. 5 like references are used for functions corresponding to the apparatus of FIG. 1A. As shown in FIG. 5, substrate 12 has transducers 19, 20, 21, 61 and 62 for generating bulk acoustic waves in response to an input signal on lines 27 and 28. Lines 27 and 28 are coupled to transducers 61 and 62 which are or may be fabricated in the same manner as transducers 19, 20, and 21. Transducers 22, 23, 24, 63, and 64 are mounted on lower surface 18 of substrate 12 for generating electric signals from bulk acoustic waves received from substrate 12. Lines 29 and 30 are coupled to transducer 22, 23, 24, 63, and 64 and function to combine the output signals from the transducers together to provide a common output. Transducer 63 is positioned to receive acoustic waves from transducer 61. Transducer 64 is positioned for receiving bulk acoustic waves from transducer 62. Transducers 19 through 24 are positioned and function in the same manner as described in FIG. 1. As shown in FIG. 5, upper surface 16 is slanted with respect to lower surface 18 at an angle $\alpha$ to provide variable thickness across substrate 12 for positioning transducers on substrate 12 which would have various acoustic path lengths for bulk acoustic wave signals transmitted into substrate 12. Transducers 61 and 63 are positioned to have an acoustical path length of l less $\frac{1}{3}$ the wavelength of the center frequency of the electroacoustic apparatus. Transducers 62 and 64 have an acoustical path length between themselves of $l + \frac{1}{3}$ of the wavelength of the center frequency of the electroacoustic apparatus. As mentioned with regard to FIGS. 1A, 1B, 2A and 2B, transducer 20 and 23 have a spacing of l and transducers 19 and 22 have a spacing of l less 1/6 the wavelength of the center frequency. Transducer 21 and 24 have a spacing of $l + 1/6$ the wavelength of the center frequency. The distances between the transducers or the acoustic path lengths are shown in FIG. 5.

Additional pairs of transducers may be added to the embodiment of FIG. 5 having path length spacings of $l + N\gamma_0/6$ where N is an integer to further optimize triple transit suppression over a wide bandwidth.

Figure 6:
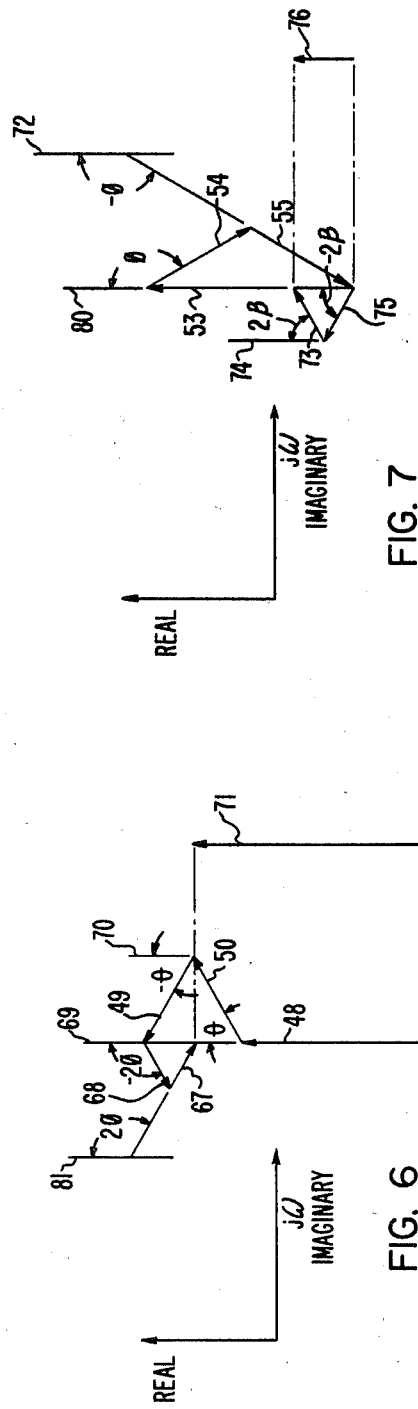
FIG. 6 is a vector diagram showing the operation of the embodiment of FIG. 5 after one pass of a bulk acoustic wave through the substrate medium.

FIG. 6 is a vector diagram showing the operation of the embodiment of FIG. 5 after one pass of a bulk acoustic wave through the substrate medium 12. In FIG. 6, the ordinate represents the real axis and the abscissa represents the imaginary axis J$\omega$. In FIG. 6, vectors 48, 49 and 50 are the same as shown in FIG. 3. FIG. 6 also shows the vectors 67 and 68. Vector 67 is oriented at $+100$ with respect to vector 48 and vector 68 is oriented at an angle of $-2\phi$ with respect to vector 48. Vector 67 represents the amplitude and phase of the signal received at transducer 63. Vector 68 represents the amplitude and phase of the signal received at transducer 64. Reference lines 69 and 70 are in line or parallel to vector 48 in FIGS. 3 and 6. Reference line 81 is likewise parallel to vector 48. The summation of vectors 48, 49, 50, 67, and 68 is represented by vector 71. If the amplitude of vector 67 and 68 are equal and since one is at an angle of $+100$ and the other is at an angle of $-2\phi$ the component along the imaginary axis is equal or opposite and cancel out. The amplitude of vectors 67 and 68 are dependent upon the area or size of transducer 63 and 64.

Figure 7:
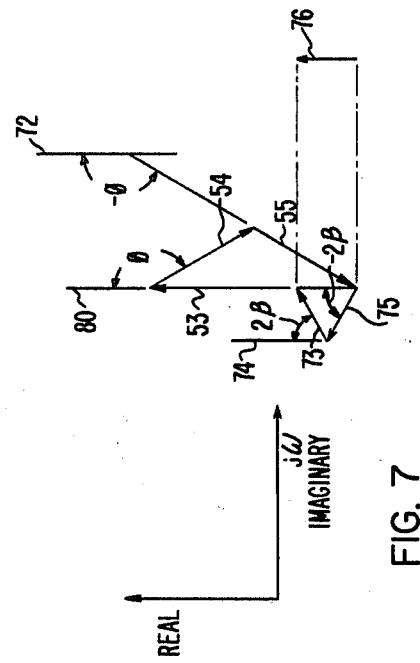
FIG. 7 is a vector diagram showing the operation of the embodiment of FIG. 5 after three passes of a bulk acoustic wave through the substrate medium.

FIG. 7 is a vector diagram showing the operation of the embodiment of FIG. 5 after three passes of a bulk acoustic wave through the substrate medium 12. In FIG. 7, the ordinate represents the real axis and the abscissa represents the imaginary axis J$\omega$. In FIG. 7, vectors 53, 54, and 55 are the same as shown in FIG. 4 for a triple transit signal. Angles $+\phi$ and $-\phi$ are the same in FIG. 7 as in FIG. 4. Reference lines 72 and 80 are in line or parallel to vector 53 in FIGS. 4 and 7. The output of transducer 63 is represented by vector 73 in FIG. 7 for a bulk acoustic wave traversing substrate 12 three times. Vector 73 is at a positive angle of $2\beta$ measured with respect to reference line 74 which is parallel to vector 53. The output of transducer 64 is represented in FIG. 7 by vector 75 which is at an angle of $-2\beta$ with respect to vector 53. Vectors 73 and 75 may be equal in amplitude and since they are at angles of $+2\beta$ and at $-2\beta$ the imaginary component may be equal and opposite and cancel leaving a real component. The summation of vectors 53, 54, 55, 73, and 75 is represented by vector 76. The suppression in db or the ratio of the power of the triple transit signal to the power of the direct signal is shown by equation 2.

$$\text{Suppression (db)} = \quad (2)$$
$$\frac{\text{Power of Triple Transit Signal}}{\text{Power of Direct Signal}} = 20 \, [\log_{10}(1 - 1.5 \cos \frac{\pi \Delta f}{f_o} + 0.5$$

-continued
$$\cos 2\pi \frac{\Delta f}{fo}) - \log_{10}[1 + 1.5 \cos \frac{\pi}{3} (1 + \frac{\Delta f}{fo}) + .5 \cos \frac{2\pi}{3} (1 + \frac{\Delta f}{fo})]$$

Figure 8:
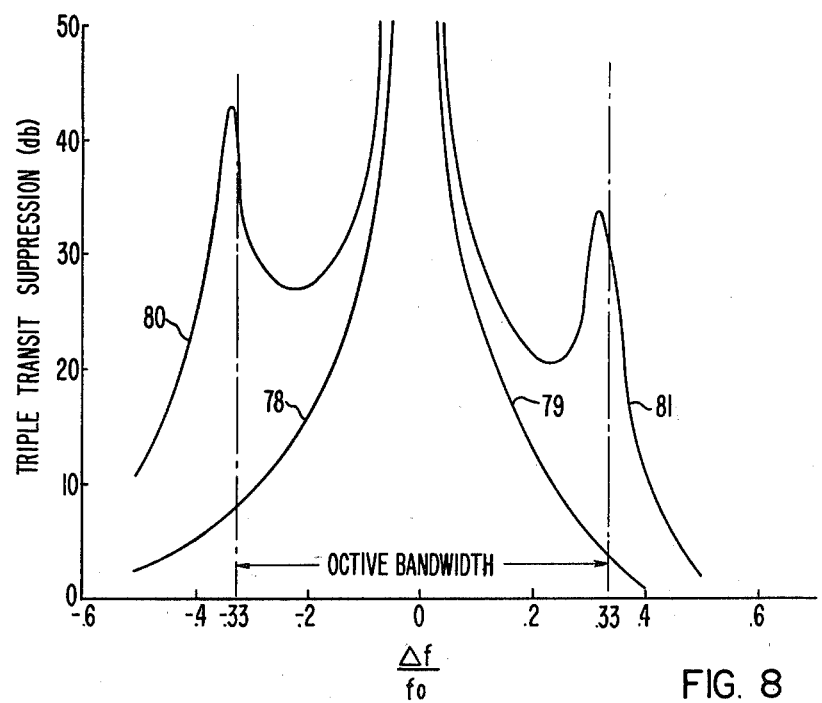
FIG. 8 is a graph showing the triple transit suppression as a function of frequency deviation about a center frequency of the embodiments in FIGS. 1A, 2A and 5.

FIG. 8 is a graph showing the triple transit suppression as a function of frequency deviation about a center frequency of the embodiments of FIGS. 1A, 2A, and 5. In FIG. 7, the ordinate represents triple transit suppression in decibels and the abscissa represents $\Delta F/F_0$ where $F_0$ is the center frequency of the electroacoustic apparatus. For the embodiments of FIGS. 1A and 2A, the triple transit suppression characteristics are shown by curves 78 and 79. The increased bandwidth for triple transit suppression by adding two additional transducers for the embodiment shown in FIG. 5, is shown by curves 80 and 81. The curves shown in FIG. 7 are particularly good to provide wide bandwidth triple transit suppression such as an octave or 67% bandwidth for delay lines with transducers operating in the near and in the fresnel zone where defraction losses are minor. This is especially applicable for delay line using bulk acoustic waves having delay times of 0.5 microseconds or less.

Electroacoustic apparatus for delaying signals and for providing wideband triple transit suppression about a predetermined center frequency has been described incorporating a substrate having an upper and lower surface, the substrate comprised of material suitable for propagating bulk acoustic waves, a first transducer mounted on the upper surface for generating bulk acoustic toward the lower surface, a second transducer mounted on the lower surface and positioned for receiving bulk acoustic waves from the first transducer and having a first acoustical path length from the first transducer to the second transducer, a third transducer mounted on the upper surface for generating bulk acoustic waves toward the lower surface, a fourth transducer mounted on the lower surface and positioned for receiving bulk acoustic waves from the third transducers and having a second acoustical path length from the third transducer to the fourth transducer, a fifth transducer mounted on the upper surface for generating bulk acoustic wave toward the lower surface, a sixth transducer mounted on the lower surface and positioned for receiving bulk acoustic waves from the fifth transducer and having a third acoustical path length from the fifth transducer to the sixth transducer, the second acoustical path length being less than the first acoustical path length by one sixth wavelength of the predetermined center frequency and the third acoustical path length being greater than the first acoustical path length by one sixth wavelength of the predetermined center frequency, means for coupling an input signal to the first, third, and fifth transducer and means for coupling together the output signals from the second, fourth, and sixth transducer to provide an output.

The invention further describes electroacoustic apparatus comprising of a plurality of delay lines having predetermined acoustical path lengths and connected in parallel.

I claim:

1. Electroacoustic apparatus for delaying signals and for providing wideband triple transit suppression about a predetermined center frequency comprising:
   a substrate having an upper and lower surface, said substrate comprised of material suitable for propagating bulk acoustic waves,
   a first transducer mounted on said upper surface for generating bulk acoustic waves toward said lower surface,
   a second transducer mounted on said lower surface and positioned for receiving bulk acoustic waves from said first transducer and having a first acoustical path length from said first transducer to said second transducer,
   a third transducer mounted on said upper surface for generating bulk acoustic waves toward said lower surface,
   a fourth transducer mounted on said lower surface and positioned for receiving bulk acoustic waves from said third transducer and having a second acoustical path length from said third transducer to said fourth transducer;
   a fifth transducer mounted on said upper surface for generating bulk acoustic waves toward said lower surface,
   a sixth transducer mounted on said lower surface and positioned for receiving bulk acoustic waves from said fifth transducer and having a third acoustical path length from said fifth transducer to said sixth transducer,
   said second acoustical path length being less than said first acoustical path length by one sixth wavelength of said predetermined center frequency, and
   said third acoustic path length being greater than said first acoustical path length by one sixth wavelength of said predetermined center frequency,
   means for coupling an input signal to said first, third and fifth transducer and
   means for coupling an output signal from said second, fourth, and sixth transducer.

2. Electroacoustic apparatus for delaying signals and for providing wideband triple transit suppression about a predetermined center frequency comprising:
   a first, second and third delay line each having an electrical input, an electrical output and a predetermined delay time,
   first means for coupling an input signal to said input of said first, second and third delay line,
   second means for coupling said output from said first, second and third delay line together to provide an output signal,
   said first, second and third delay line each including a substrate of material suitable for propagating bulk acoustic waves, a first transducer mounted on said substrate and coupled to said input for generating bulk acoustic waves from electrical signals, a second transducer mounted on said substrate and coupled to said output for generating electrical signals from bulk acoustic waves, said second transducer positioned to receive bulk acoustic waves generated by said first transducer,
   said first delay line having a predetermined delay time $\tau$,
   said second delay line having a predetermined delay time of $\tau$ less the time required for a bulk acoustic wave of said predetermined center frequency to travel one sixth of its wavelength,
   said third delay line having a predetermined delay time of $\tau$ plus the time required for a bulk acoustic wave of said predetermined center frequency to travel one sixth of its wavelength,
   whereby the output signals from said three delay lines combine to provide a reduced output signal from bulk acoustic waves traversing each of said delay lines three times.

* * * * *